(12) United States Patent
Schaffer et al.

(10) Patent No.: US 6,489,634 B1
(45) Date of Patent: Dec. 3, 2002

(54) MICROELECTRONIC DEVICE STRUCTURE UTILIZING A DIAMOND INLAY IN A PACKAGE FLANGE

(75) Inventors: Christopher Schaffer, Long Beach, CA (US); Steven R. Burkhart, Hermosa Beach, CA (US); Bartley J. Price, El Segundo, CA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/938,073

(22) Filed: Aug. 22, 2001

(51) Int. Cl.⁷ .................. H01L 31/0312; H01L 23/10
(52) U.S. Cl. .............. 257/77; 257/706; 257/707; 257/708; 257/712; 257/713; 257/732
(58) Field of Search ................ 257/77, 699, 706, 257/707, 708, 712, 713, 720, 732, 762, 622, 711

(56) References Cited

U.S. PATENT DOCUMENTS 4,649,992 A * 3/1987 Geen et al. ............... 165/185

FOREIGN PATENT DOCUMENTS

JP          6151661    * 5/1994 ............... 257/77

* cited by examiner

*Primary Examiner*—Minh Loan Tran
*Assistant Examiner*—Tan Tran
(74) *Attorney, Agent, or Firm*—John R. Rafter; Terje Gudmestad

(57) ABSTRACT

A microelectronic device structure includes a package flange with a body having a body upper surface, a substantially circular body interior sidewall defining an opening in the body upper surface, and a substantially circular inlay made of CVD diamond. The inlay is received into the substantially circular opening and has an inlay exterior sidewall which is adjacent to the body interior sidewall and is brazed thereto. The inlay has an inlay upper surface that is substantially coplanar with the body upper surface. A microelectronic device is affixed to the inlay upper surface.

20 Claims, 2 Drawing Sheets

MICROELECTRONIC DEVICE STRUCTURE UTILIZING A DIAMOND INLAY IN A PACKAGE FLANGE

This invention was made with government support under contract MDA972-96-C-0018 awarded by DARPA. The government has certain rights in this invention.

This invention relates to microelectronic device structures, and, more particularly, to increasing the thermal conductivity of the package flange that supports the microelectronic device.

BACKGROUND OF THE INVENTION

A microelectronic device typically has a large number of active and passive circuit elements formed in a semiconductor material, the unitary structure being termed a die or chip. The die is small in size and relatively fragile. It is therefore affixed to and supported on a support structure which includes a package flange and, optionally, a cover. The support structure physically supports and protects the die, and provides the points of electrical interconnection to the circuit elements on the die.

The removal of heat from microelectronic devices, particularly from those that process high-power signals, is often the limiting factor in their utilization. If a sufficient quantity of heat is not removed, the temperature of the microelectronic device rises and eventually exceeds its operating limits. In the usual case, the support structure provides a conductive heat flow path for removal of heat from the die. A number of different support materials and support structure designs have been developed to maximize the removal of heat from the microelectronic device and through the support structure.

Chemical vapor deposited (CVD) diamond has been identified as a particularly useful material of construction for the support structure, because of its high thermal conductivity. However, the CVD diamond is expensive, and usually constitutes only a portion of the support structure directly under the die of the microelectronic device. That is, the CVD diamond portion of the support structure is bonded to the remainder of the support structure, and the microelectronic device is mounted to the CVD diamond portion.

While this approach is operable, it has drawbacks. Differential thermal strains and stresses between the remainder of the support structure, the diamond portion of the support structure, and the microelectronic device die can adversely affect the operation of the microelectronic device and/or lead to debonding. The interface between the diamond and the remainder of the support structure constitutes a thermal impedance in the heat flow away from the microelectronic device, and a high-conductivity interface may be difficult to achieve in the case of diamond.

There is a need for an improved approach to heat removal from microelectronic device dies in package structures. The present invention fulfills this need, and further provides related advantages.

SUMMARY OF THE INVENTION

The present invention provides a microelectronic device structure having a package flange with improved thermal properties to remove heat from a supported electronic device. A composite diamond structure is used, but differential thermal strains and stresses are reduced as compared with prior approaches. Fabrication of the package flange with precision alignment is readily achieved.

In accordance with the invention, a microelectronic device structure comprises a package flange having a body with a body upper surface, a substantially circular body interior sidewall defining an opening in the body upper surface, and a substantially circular inlay comprising diamond, preferably chemical vapor deposited (CVD) diamond. The inlay is received into the substantially circular opening of the body upper surface, and the inlay has an inlay exterior sidewall that is adjacent to, and preferably contacting in places, the body interior sidewall. Preferably, the inlay has an inlay upper surface which is substantially coplanar with the body upper surface. In service, a microelectronic device is typically affixed to the inlay upper surface.

In one embodiment, the body comprises a planar shim and a planar base contacting and affixed to the shim. The body interior sidewall extends through the base but not through the shim. Preferably, the shim is copper and the base is copper-tungsten or Silvar™ material.

To facilitate fabrication and minimize differential thermal strains and stresses, the inlay exterior sidewall is preferably tapered inwardly with increasing distance from an inlay upper surface. The inlay is press fit into the opening, and then the inlay exterior sidewall is affixed to the body interior sidewall with a joining material.

The present approach uses a circular diamond inlay, rather than a diamond inlay of another shape. The use of the circular inlay maximizes the sidewall surface area through which heat is conducted for any selected upper surface area. The circular shape also minimizes the thermal stresses in the relatively brittle inlay, due to the short moment arm to the inlay exterior sidewall and the relatively large shear volume in the inlay.

Because circular inner and outer sidewalls may usually be cut more accurately to precision tolerances than other shapes, and the inner sidewall may be reamed to a precise dimension, the present approach permits the fabrication of the body and the inlay more readily than if another shape were used. The result is more accurate alignment of the body and the inlay, and a closer planarity of the upper surfaces of the body and the inlay.

During assembly, the inlay is press fit into the opening of the body, producing radially inwardly directed compressive stresses in the body that hold the inlay in place during subsequent brazing. The inwardly directed compressive stresses in the shim aid in maintaining a good contact at the circular interface between the inlay and the shim.

In the preferred embodiment wherein the body has two layers, the shim of which is soft copper, the copper may be easily planarized after the press fitting and brazing. The copper shim is easily made planar by sanding or other comparable operation.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
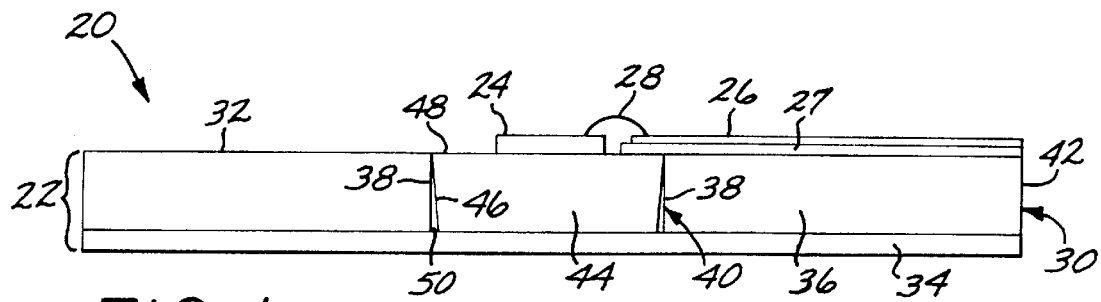
FIG. 1 is a sectional view of a microelectronic device structure.
Figure 2:
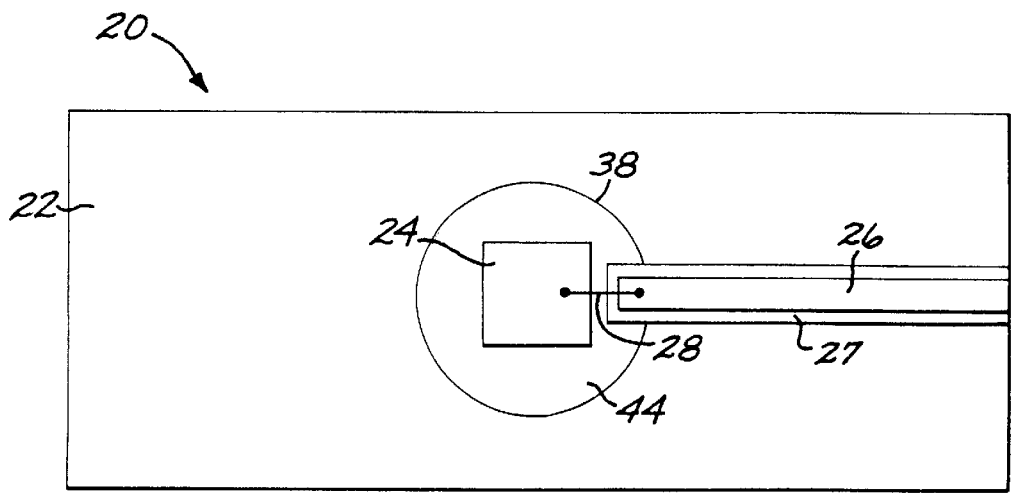
FIG. 2 is a plan view of the microelectronic device structure of FIG. 1.

FIGS. 1 and 2 illustrate a microelectronic device structure 20 having a package flange 22 and a microelectronic device (also termed a microelectronic device die) 24 mounted thereon. There may optionally be a cover (not shown) overlying the package flange 22. An electrically conductive trace 26 is deposited on and lies on a substrate 27, which in turn is bonded and affixed to an upper surface of the package flange 22. A wire 28 forms a wirebond electrical interconnect between a pad on the microelectronic device 24 and the trace 26. Typically there are many wires and many wirebond electrical interconnects to many traces on the package flange, but only one is shown here to avoid clutter.

The package flange 22 includes a body 30 having a body upper surface 32. The body 30 preferably includes a substantially planar shim 34 and a substantially planar base 36 contacting and affixed to the shim 34. The shim 34 is preferably copper. The base 36 is preferably a metal such as either copper-tungsten composite powder material having about 20 percent by weight copper powder and 80 percent by weight tungsten powder, or Silvar™ material. Silvar™ material is an iron-nickel-cobalt foam material which has been infiltrated with silver metal and rolled. Other low-thermal-expansion, thermally conductive materials may be used as well. The base desirably has a coefficient of thermal expansion of about that of the diamond inlay, and is as thermally conductive as possible.

The body 30 includes a substantially circular (in the plan view of FIG. 2) body interior sidewall 38 defining a substantially circular (in the plan view of FIG. 2) opening 40 in the body upper surface 32. (All references to "circular" shape herein are from the perspective of a plan or top view as in FIG. 2.) The body 30 also typically includes a body exterior sidewall 42, which is distinct from the body interior sidewall 38. In the case where the body 30 includes the shim 34 and the base 36, the body interior sidewall 38 desirably extends through the base 36 but not through the shim 34, so that the opening 40 is only through the base 36.

Figure 4:
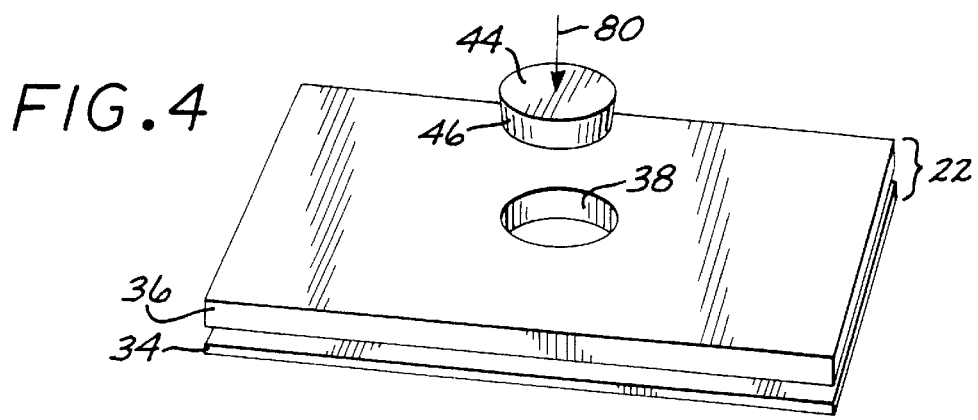
FIG. 4 is a perspective exploded schematic view of a microelectronic device structure at an intermediate stage of preparation, with some elements omitted so that the assembly approach may be seen more clearly.

The package flange 22 further includes a substantially circular (when viewed in the plan view of FIG. 2) inlay 44 comprising diamond, most preferably chemical vapor deposited (CVD) diamond. The substantially circular inlay 44 is received into the substantially circular opening 40 of the body upper surface 32. The inlay 44 has an inlay exterior sidewall 46 that is adjacent to and contacting the body interior sidewall 38 over at least a portion of their lengths but preferably not over all of their lengths. Instead, the inlay exterior sidewall 46 is desirably tapered inwardly (i.e., toward the circular center of the inlay) with increasing distance from an inlay upper surface 48, a result of the laser cutting process. As seen in FIGS. 1 and 4, the inlay 44 is shaped somewhat like a short cork for a bottle. With this configuration, the inlay 44 contacts the body 30 directly only at and near their respective upper surfaces 48 and 32. The remaining space between the inlay exterior sidewall 46 and the body interior sidewall 38 is filled at least in part with a joint 50 of a braze material such as a cusil silver-copper alloy having a composition of about 72 weight percent silver, balance copper. The joint 50 joins the inlay 44 to the body 30 to form the package flange 22.

The inlay upper surface 48 is desirably substantially coplanar with the body upper surface 32. The microelectronic device 24 is mounted to the inlay upper surface 48.

The inlay 44 must be substantially circular when viewed in plan view from above, as in FIG. 2. The circular shape, as distinct from other shapes such as square, rectangular, prismatic, or oval, imparts the desirable properties discussed earlier. Shapes other than substantially circular are not within the scope of the invention. Although a circular shape of diamond is somewhat more expensive in materials cost than a rectangular or other prismatic shape due to the fact that there is some waste material when the circular shape is machined, this materials cost is offset by the easier and less-costly machining and the technical benefits to the package flange structure achieved with the circular shape such as reduced thermal stresses and improved planarity of the inlay upper surface and the body upper surface.

The dimensions of the microelectronic device structure 20 are not critical, and are established in part by the size of the microelectronic device 24. The circular diameter of the substantially circular inlay 44 must be sufficiently large to easily receive the microelectronic device 24 thereon. The thickness of the package flange 22 is typically about 0.060 inch. Where present, the shim 34 is about 0.005 inch to about 0.010 inch thick and the base 36 is about 0.050 inch thick. The maximum circular diameter of the inlay exterior sidewall 46 is preferably greater than the maximum circular diameter of the body interior sidewall 38 by about 0.0003 inch to about 0.005 inch, so that there is a press fit when the inlay 44 is pressed into the opening 40. The soft base 36 deforms to accommodate the press fit of the inlay 44. The substrate 27 is preferably made of aluminum oxide about 0.010 inch thick.

Figure 3:
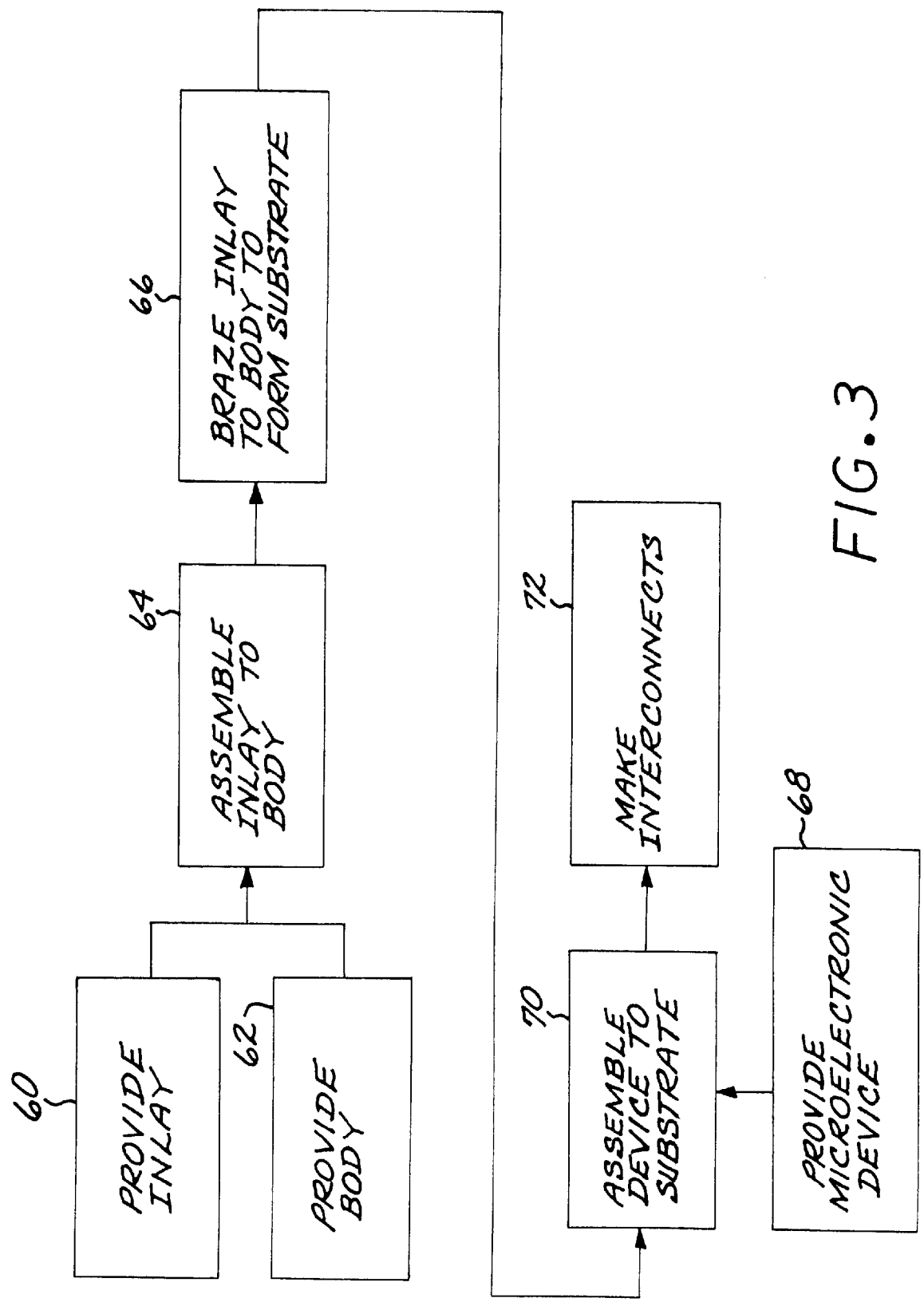
FIG. 3 is a block flow diagram of an approach for preparing the microelectronic device structure of FIGS. 1 and 2.

FIG. 3 is a block flow diagram of a preferred approach for practicing the invention. The inlay 44 is provided, numeral 60, and the body 30 is provided, numeral 62. The inlay 44 is a piece of diamond that is laser cut to shape with the inlay exterior sidewall 46 preferably slightly angled inwardly as depicted in FIG. 1. The body 30 is fabricated with the opening 40, preferably machined and then reamed to the desired final diameter. The inlay 44 is assembled into the opening 40 of the body 30, preferably with a press fit, numeral 64. FIG. 4 is an exploded view of the structure during this step, with the arrow 80 indicating the press fit. The inlay 44 is pressed downwardly to a location such that the inlay upper surface 48 is substantially coplanar with the body upper surface 32. The diamond of the inlay 44 is harder than the metallic alloy of the base 36, so that the metallic alloy of the base 36 deforms as the diamond inlay 44 is press fit into the opening 40. The inlay 44 is thereafter brazed to the body 30 using the braze material, numeral 66. In the preferred embodiment, the braze material used in step 66 is the cusil silver-copper alloy discussed previously. The substrate 27 is thereafter brazed to the upper surfaces 32 and 48 using a braze alloy having a lower melting point than the cusil material, preferably an alloy of 88 weight percent gold, balance germanium.

The microelectronic device 24 is provided as a stand-alone unit, numeral 68, prepared separately by techniques appropriate to that device. The fabrication of the microelectronic device 24 is not a part of the present invention. The microelectronic device 24 is assembled and joined to the package flange 22, and specifically to the inlay 44, by any appropriate technique, numeral 70. Typically, the microelectronic device 24 is brazed to the insert 44 using a brazing material having a lower melting point than the braze material in the joint 50 and the braze material used to attach the substrate 27, and which brazes at a temperature that will not adversely affect the microelectronic device 24. The preferred braze material for step 70 is an alloy of 80 weight percent gold, balance silicon. The wire interconnect between the microelectronic device 24 and the trace 26 is formed, typically by wire bonding, numeral 72.

The present invention has been reduced to practice using the preferred approach described herein and as illustrated in FIGS. 1–4. The microelectronic device structure has been qualified for spacecraft applications.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A microelectronic device structure comprising a package flange having
   a body with a body upper surface, wherein the body comprises a planar shim and a planar base contacting and affixed to the shim;
   a substantially circular body interior sidewall defining an opening in the body upper surface, wherein the body interior sidewall extends through the base but not through the shim; and
   a substantially circular inlay comprising diamond, wherein the inlay is received into the substantially circular opening of the body upper surface, and wherein the inlay has an inlay exterior sidewall that is adjacent to the body interior sidewall.

2. The microelectronic device structure of claim 1, wherein the shim is copper and the body is metal.

3. The microelectronic device structure of claim 1, wherein the diamond is chemical vapor deposited diamond.

4. The microelectronic device structure of claim 1, wherein the inlay has an inlay upper surface which is substantially coplanar with the body upper surface.

5. The microelectronic device structure of claim 1, wherein the inlay is press fit into the opening.

6. The microelectronic device structure of claim 1, wherein the inlay is affixed to the body with a braze metal.

7. The microelectronic device structure of claim 1, wherein the inlay has an inlay upper surface, and wherein the microelectronic device structure further includes
   a microelectronic device affixed to the inlay upper surface.

8. A microelectronic device structure comprising a package flange having
   a body with a body upper surface;
   a substantially circular body interior sidewall defining an opening in the body upper surface; and
   a substantially circular inlay comprising diamond, wherein the inlay is received into the substantially circular opening of the body upper surface, and wherein the inlay has an inlay exterior sidewall that is adjacent to the body interior sidewall, wherein the inlay exterior sidewall is tapered inwardly with increasing distance from an inlay upper surface.

9. The microelectronic device structure of claim 4, wherein the inlay has an inlay upper surface, and wherein the microelectronic device structure further includes
   a microelectronic device affixed to the inlay upper surface.

10. The microelectronic device structure of claim 8, wherein the inlay is affixed to the body with a braze metal.

11. The microelectronic device structure of claim 8, wherein the shim is copper and the body is metal.

12. A microelectronic device structure comprising a package flange having
   a body with a body upper surface;
   a substantially circular body interior sidewall defining an opening in the body upper surface;
   a substantially circular inlay comprising diamond, wherein the inlay is received into the substantially circular opening of the body upper surface, and wherein the inlay has an inlay exterior sidewall that is adjacent to the body interior sidewall, wherein the inlay has an inlay upper surface;
   a microelectronic device affixed to the inlay upper surface
   a substrate affixed to the inlay upper surface and to the body upper surface;
   an electrically conducting trace lying on the substrate; and
   an electrical interconnect extending between the microelectronic device and the trace.

13. The microelectronic device structure of claim 12, wherein the inlay is affixed to the body with a braze metal.

14. A microelectronic device structure comprising
   a package flange having
      a body having a body upper surface, wherein the body comprises a planar shim and a planar base contacting and affixed to the shim,
      a substantially circular body interior sidewall defining an opening in the body upper surface, wherein the body interior sidewall extends through the base but not through the shim, and
      a substantially circular inlay made of chemical vapor deposited diamond, wherein the inlay is received into the substantially circular opening and has an inlay exterior sidewall which is adjacent to the body interior sidewall, and wherein the inlay has an inlay upper surface that is substantially coplanar with the body upper surface; and
   a microelectronic device affixed to the inlay upper surface.

15. The microelectronic device structure of claim 14, wherein the shim is copper.

16. The microelectronic device structure of claim 14, wherein the inlay is affixed to the body with a braze metal.

17. A microelectronic device structure comprising
   a package flange having
      a body having a body upper surface,
      a substantially circular body interior sidewall defining an opening in the body upper surface, and
      a substantially circular inlay made of chemical vapor deposited diamond, wherein the inlay is received into the substantially circular opening and has an inlay exterior sidewall which is adjacent to the body interior sidewall, and wherein the inlay has an inlay upper surface that is substantially coplanar with the body upper surface, wherein the inlay exterior sidewall is tapered inwardly with increasing distance from the inlay upper surface; and
   a microelectronic device affixed to the inlay upper surface.

18. The microelectronic device structure of claim 17, wherein the inlay is affixed to the body with a braze metal.

19. A microelectronic device structure comprising
   a package flange having
      a body having a body upper surface,
      a substantially circular body interior sidewall defining an opening in the body upper surface, and a substantially circular inlay made of chemical vapor deposited diamond, wherein the inlay is received into the substantially circular opening and has an inlay exterior sidewall which is adjacent to the body interior sidewall, and wherein the inlay has an inlay upper surface that is substantially coplanar with the body upper surface;

a microelectronic device affixed to the inlay upper surface;

a substrate affixed to the inlay upper surface and to the body upper surface;

an electrically conducting trace lying on the substrate; and an electrical interconnect extending between the microelectronic device and the trace.

20. The microelectronic device structure of claim 19, wherein the inlay is affixed to the body with a braze metal.

* * * * *